(12) United States Patent
Takino et al.

(10) Patent No.: US 12,009,219 B2
(45) Date of Patent: Jun. 11, 2024

(54) SUBSTRATE PROCESSING METHOD

(71) Applicant: Tokyo Electron Limited, Tokyo (JP)

(72) Inventors: Yusuke Takino, Miyagi (JP); Takayuki Hoshi, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 24 days.

(21) Appl. No.: 17/553,879

(22) Filed: Dec. 17, 2021

(65) Prior Publication Data
US 2022/0199415 A1    Jun. 23, 2022

(30) Foreign Application Priority Data

Dec. 17, 2020   (JP) .................. 2020-209374

(51) Int. Cl.
*H01L 21/3065* (2006.01)
*H01J 37/32* (2006.01)
*H01L 21/308* (2006.01)
*H01L 21/311* (2006.01)

(52) U.S. Cl.
CPC ...... *H01L 21/30655* (2013.01); *H01J 37/321* (2013.01); *H01L 21/3065* (2013.01); *H01L 21/308* (2013.01); *H01L 21/31116* (2013.01); *H01J 2237/334* (2013.01)

(58) Field of Classification Search
None
See application file for complete search history.

(56) References Cited

U.S. PATENT DOCUMENTS 9,378,971 B1   6/2016  Briggs et al.
2016/0322230 A1*  11/2016  Shimoda .............. H01L 21/3065

* cited by examiner

Primary Examiner — Jiong-Ping Lu
(74) Attorney, Agent, or Firm — XSENSUS LLP

(57) ABSTRACT

A plasma processing method includes: (a) providing a substrate having an etching target film with a recess formed therein, on a substrate support; (b) forming a protective film on a side wall of the recess; (c) after (b), generating plasma from a processing gas to etch a bottom of the recess; and (d) performing a sequence including (b) and (c) one or more times. The step (c) includes a first stage of etching the bottom of the recess while suppressing a formation of a shoulder portion caused when reaction by-products produced by the etching adhere to the side wall, and a second stage of further etching the bottom of the recess in a state where a temperature of the substrate support is controlled to −40° C. or lower, after the first stage.

15 Claims, 11 Drawing Sheets

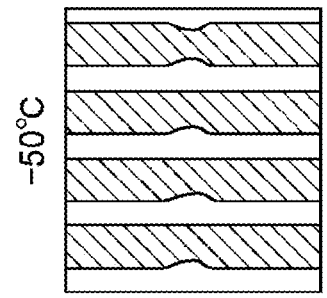
FIG. 9E −20°C
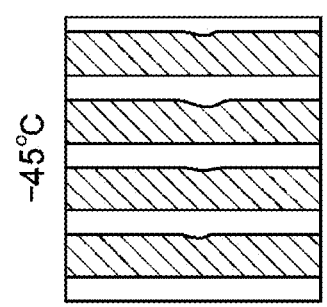
FIG. 9D −35°C
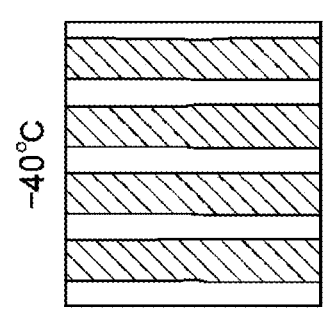
FIG. 9C −40°C
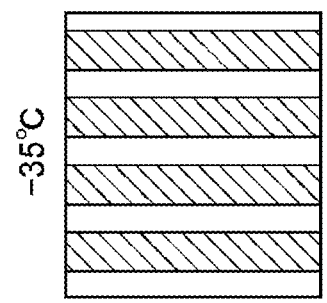
FIG. 9B −45°C
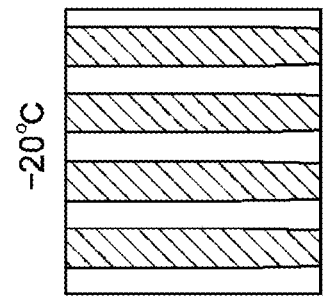
FIG. 9A −50°C

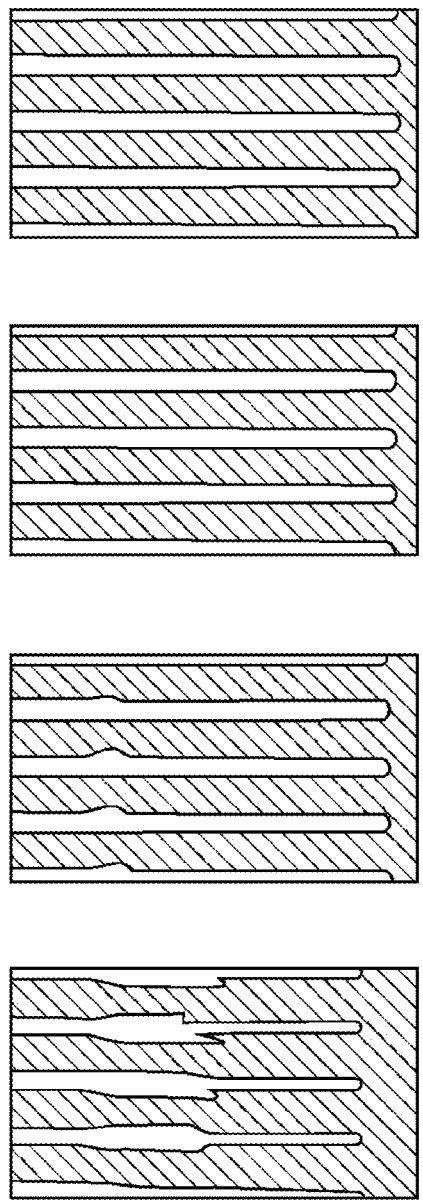

SUBSTRATE PROCESSING METHOD

CROSS-REFERENCE TO RELATED APPLICATION

This application is based on and claims priority from Japanese Patent Application No. 2020-209374, filed on Dec. 17, 2020, with the Japan Patent Office, the disclosure of which is incorporated herein in its entirety by reference.

TECHNICAL FIELD

The present disclosure relates to a substrate processing method.

BACKGROUND

U.S. Pat. No. 9,378,971 discloses a method of forming a recess etched in a dielectric material on a semiconductor substrate. In this method, first plasma containing an etching reactant is generated, and the substrate is exposed to the first plasma to partially etch the recess in the dielectric material. Then, a protective film is deposited on the side wall of the recess using an atomic layer deposition method. The etching and the deposition are repeated until the recess is etched to a target depth.

SUMMARY

According to an aspect of the present disclosure, a plasma processing method includes: (a) providing a substrate having an etching target film with a recess formed therein, on a substrate support; (b) forming a protective film on a side wall of the recess; (c) after (b), generating plasma from a processing gas to etch a bottom of the recess; and (d) performing a sequence including (b) and (c) one or more times. The step (c) includes a first stage of etching the bottom of the recess while suppressing a formation of a shoulder portion caused when reaction by-products produced by the etching adhere to the side wall, and a second stage of further etching the bottom of the recess in a state where a temperature of the substrate support is controlled to −40° C. or lower, after the first stage.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 9A to 9E are views schematically illustrating an example of a shape of the side wall of the recess formed by the etching.

FIGS. 11A to 11D are views schematically illustrating an example of the shape of the side wall of the recess formed by the etching.

DETAILED DESCRIPTION

Figure 1:
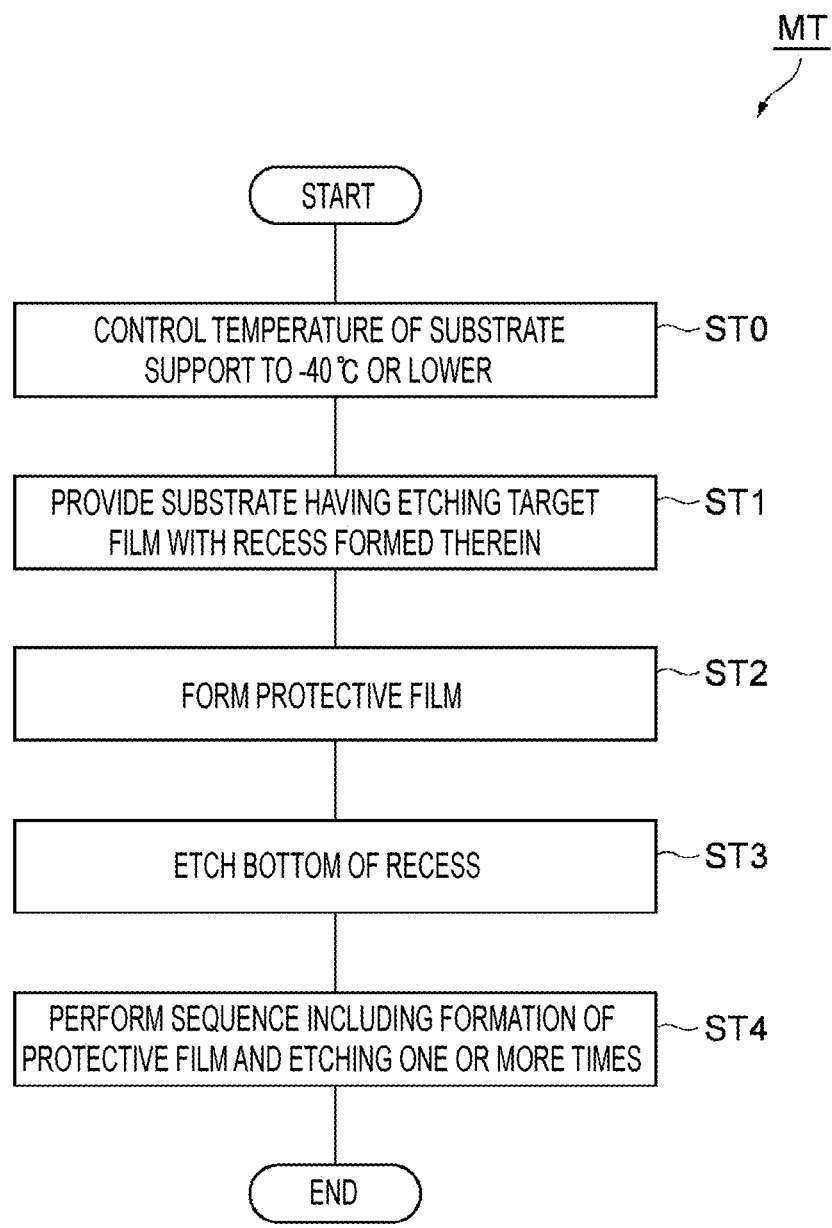
FIG. 1 is a flowchart of a substrate processing method according to an embodiment.

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, various embodiments will be described

In an embodiment, a plasma processing method includes: (a) providing a substrate having an etching target film with a recess formed therein, on a substrate support; (b) forming a protective film on a side wall of the recess; (c) after (b), generating plasma from a processing gas to etch a bottom of the recess; and (d) performing a sequence including (b) and (c) one or more times. The step (c) includes a first stage of etching the bottom of the recess while suppressing a formation of a shoulder portion caused when reaction by-products produced by the etching adhere to the side wall, and a second stage of further etching the bottom of the recess by controlling a temperature of the substrate support to −40° C. or lower.

According to the method above, a shape defect (bowing) of the side wall of the recess formed by an etching may be suppressed.

The formation of the shoulder portion may be suppressed by suppressing the reaction by-products from adhering to the side wall and/or by removing the reaction by-products adhering to the side wall.

In the first stage, the etching may be performed in a state where the temperature of the substrate support is set to a temperature higher than −40° C.

The etching target film may be a silicon-containing film. The processing gas may include a halogen-containing gas that contains no carbon atoms and nitrogen atoms, and an oxygen-containing gas. In the first stage, the etching may be performed in a state where a ratio of a flow rate of the oxygen-containing gas to a total flow rate of the halogen-containing gas and the oxygen-containing gas is set to a first ratio. In the second stage, the etching may be performed in a state where the ratio is set to a second ratio larger than the first ratio.

The halogen-containing gas may include at least one gas selected from a group consisting of $SF_6$ gas, $Cl_2$ gas, and HBr gas.

The oxygen-containing gas may include $O_2$ gas.

The silicon-containing film may include a silicon film or a silicon germanium film.

The first ratio may be 35 vol % or less. In this case, the shape defect of the side wall of the recess formed by the etching may be remarkably suppressed.

In (a), the substrate with the recess formed therein may be provided by etching the etching target film in a state where the temperature of the substrate support is controlled to −40° C. or lower. An etching condition in (a) may be the same as an etching condition in the second stage.

A time period of the second stage may be six times or less a time period of the first stage.

An etching depth of the recess etched in the first stage is 1 µm or less.

In (c), the first stage may be switched to the second stage in a state where plasma is generated.

The steps (a) to (d) may be performed in situ.

Hereinafter, various embodiments will be described in detail with reference to the drawings. In the drawings, the same or corresponding parts will be denoted by the same reference numerals.

Figure 2:
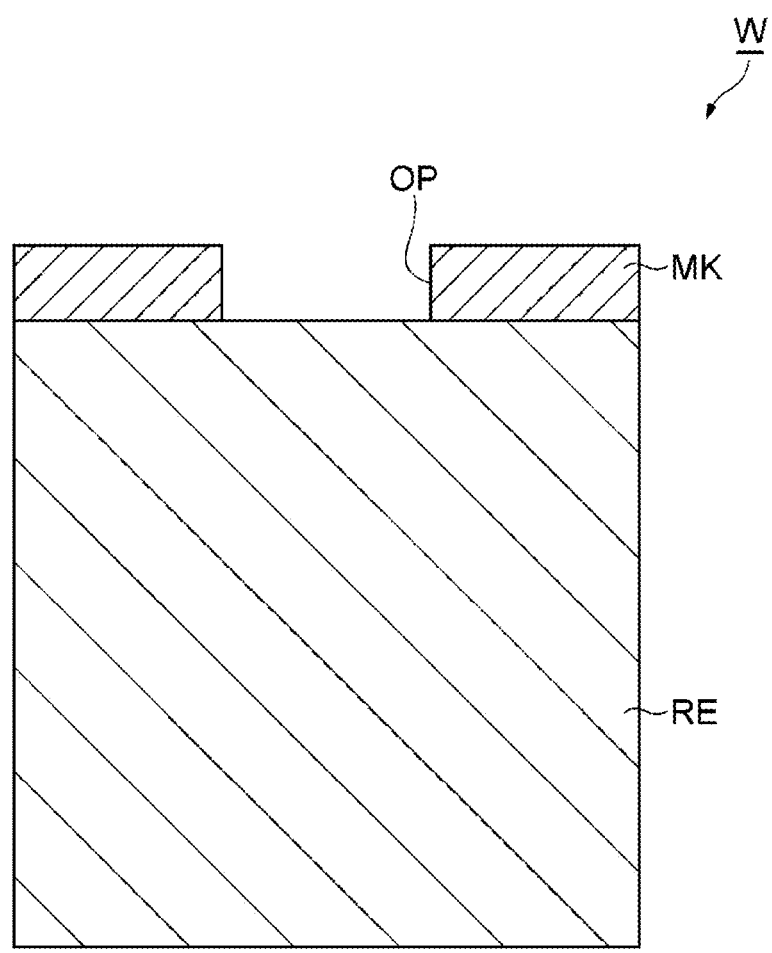
FIG. 2 is a partially enlarged cross-sectional view illustrating an example of a substrate.

FIG. 1 is a flowchart of a substrate processing method according to an embodiment. The substrate processing method illustrated in FIG. 1 (hereinafter, referred to as a "method MT") is performed to etch a region in a substrate. FIG. 2 is a partially enlarged cross-sectional view of an example of the substrate. The substrate W illustrated in FIG. 2 may have a region RE and a mask MK.

The region RE is an etching target film in the method MT. In the substrate W illustrated in FIG. 2, the mask MK is provided on the region RE. The mask MK is in a patterned state. That is, the mask MK provides one or more openings OP to partially expose the region RE. The width of each opening OP provided by the mask MK may be, for example, 100 nm or less. The distance between adjacent openings OP may be, for example, 100 nm or less.

The region RE may contain silicon and/or germanium. The region RE may include a silicon-containing film. The silicon-containing film may include at least one of a silicon film, a silicon germanium film, a silicon oxide film, and a silicon nitride film. The silicon-containing film may be a multilayer film that includes a silicon film and a silicon germanium film. The silicon-containing film may contain at least one of single crystal silicon, silicon containing a dopant, and silicon germanium.

The mask MK may include at least one of a silicon oxide film, a silicon nitride film, a silicon carbide film, an organic film, and a metal film. The organic film may include at least one of a spin on carbon (SOC) film and an amorphous carbon film. The metal film may contain tungsten or titanium.

Figure 3:
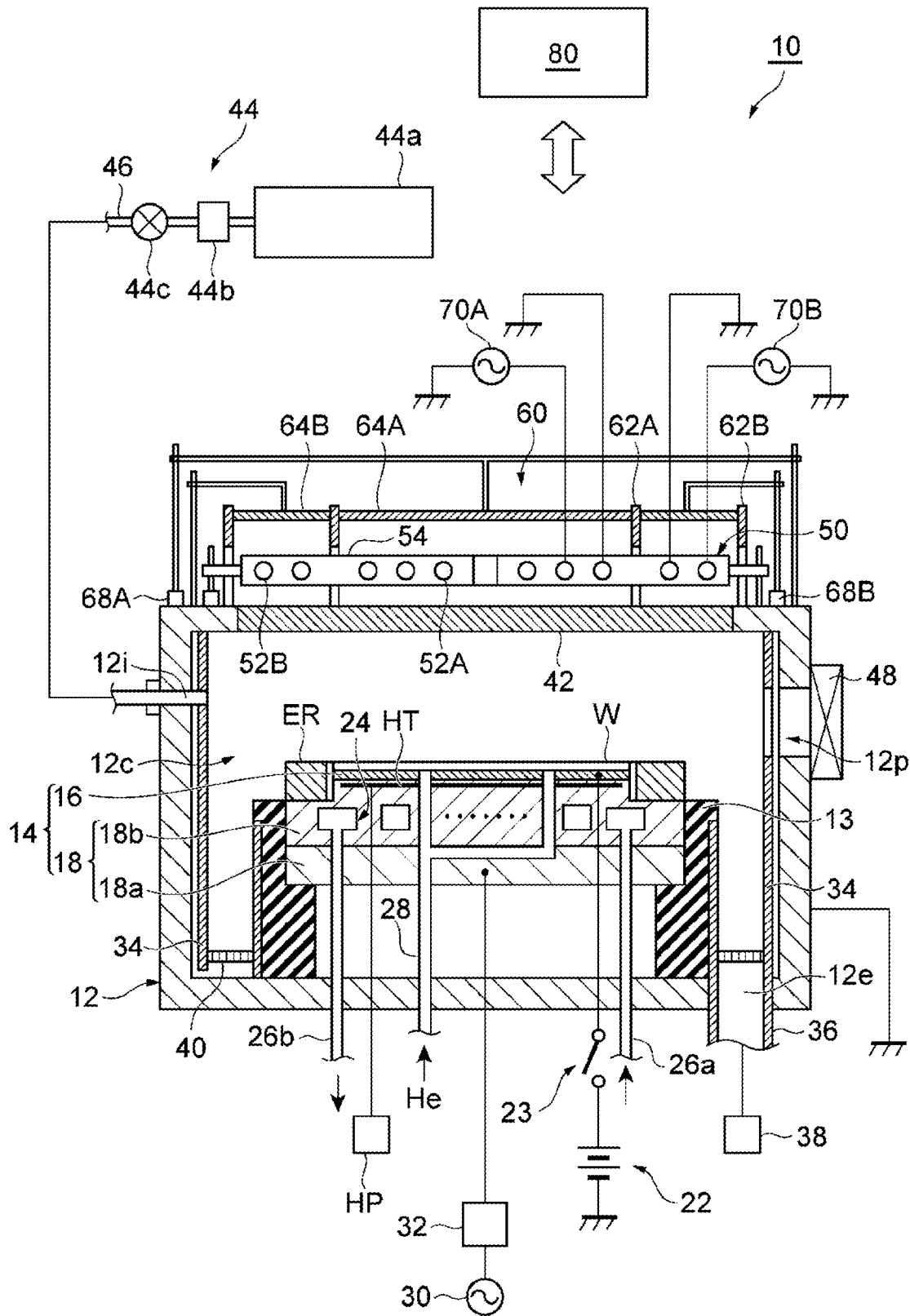
FIG. 3 is a view schematically illustrating an example of a substrate processing apparatus.

In an embodiment, the method MT is performed using a substrate processing apparatus. FIG. 3 is a view schematically illustrating an example of the substrate processing apparatus. The substrate processing apparatus illustrated in FIG. 3 is an inductively-coupled plasma (ICP) apparatus 10.

The plasma processing apparatus 10 includes a chamber 12. The chamber 12 is formed of a metal containing, for example, Al (aluminum) or Y (yttrium). For example, the chamber 12 is formed of $Al_2O_3$ or $Y_2O_3$. The chamber 12 has, for example, a substantially cylindrical shape. An internal space 12c is provided in the chamber 12 such that a processing is performed in the internal space 12c.

A substrate support 14 is disposed below the internal space 12c. The substrate support 14 is configured to hold the substrate W placed thereon. The substrate W is, for example, a semiconductor wafer.

The substrate support 14 may be supported by a support 13. The support 13 extends upward from the bottom of the chamber 12 inside the internal space 12c. The support 13 may have a substantially cylindrical shape. The support 13 may be formed of an insulating material such as quartz.

The substrate support 14 includes an electrostatic chuck 16 and a lower electrode 18. The lower electrode 18 includes a first plate 18a and a second plate 18b. The first plate 18a and the second plate 18b are formed of a metal such as aluminum. The first plate 18a and the second plate 18b have, for example, a substantially cylindrical shape. The second plate 18b is disposed on the first plate 18a. The second plate 18b is electrically connected to the first plate 18a.

The electrostatic chuck 16 is disposed on the second plate 18b. The electrostatic chuck 16 includes an insulating layer and a thin film electrode disposed inside the insulating layer. A DC power supply 22 is electrically connected to the thin film electrode of the electrostatic chuck 16 via a switch 23. The electrostatic chuck 16 generates an electrostatic force from a DC voltage of the DC power supply 22. The electrostatic chuck 16 attracts and holds the substrate W by the generated electrostatic force.

In the plasma processing apparatus 10, an edge ring ER is disposed on and around the second plate 18b to surround the outer peripheries of the substrate W and the electrostatic chuck 16. The edge ring ER has a function to improve the uniformity of a process. The edge ring ER is made of, for example, silicon.

A flow path 24 is formed in the second plate 18b. A heat exchange medium such as a coolant is supplied to the flow path 24 from a temperature controller (e.g., a chiller unit) disposed outside the chamber 12, for a temperature control. The temperature controller adjusts the temperature of the heat exchange medium. The heat exchange medium is supplied from the temperature controller to the flow path 24 through a pipe 26a. The heat exchange medium supplied from the temperature controller to the flow path 24 through the pipe 26a is sent back to the temperature controller through a pipe 26b. The heat exchange medium is returned to the flow path 24 in the substrate support 14 after the temperature thereof is adjusted by the temperature controller. In this way, the temperature of the substrate support 14, that is, the temperature of the substrate W may be adjusted.

The plasma processing apparatus 10 further includes a gas supply line 28 that extends to the upper surface of the electrostatic chuck 16 while penetrating the substrate support 14. A heat exchange gas such as helium (He) gas is supplied from a heat exchange gas supply mechanism to the space between the upper surface of the electrostatic chuck 16 and the lower surface of the substrate W, through the gas supply line 28. The heat exchange gas promotes the heat exchange in the space between the substrate support 14 and the substrate W.

Further, a heater HT may be disposed in the substrate support 14. The heater HT is a heating device. The heater HT is embedded in, for example, the second plate 18b or the electrostatic chuck 16. The heater HT is connected to a heater power supply HP. When the heater power supply HP supplies a power to the heater HT, the temperature of the substrate support 14, and furthermore, the temperature of the substrate W are adjusted.

A bias power supply 30 is connected to the lower electrode 18 of the substrate support 14. The bias power supply 30 generates a bias power used to draw ions into the substrate W. In an embodiment, the bias power supply 30 may be a radio-frequency power supply that generates a radio-frequency (RF) power as the bias power. When the radio-frequency power supply is used as the bias power supply 30, the frequency of the bias power falls within a range of, for example, 400 kHz to 40.68 MHz. In an example, the frequency of the bias power may be 13.56 MHz. In the present embodiment, the bias power supply 30 is connected to the lower electrode 18 via a matching device 32. The matching device 32 includes a circuit that performs a matching between the output impedance from the bias power supply 30 and the impedance of the load side, that is, the lower electrode 18.

The plasma processing apparatus 10 further includes a shield 34 detachably attached to the inner wall of the chamber 12. The shield 34 is disposed to surround the outer periphery of the support 13. The shield 34 suppresses by-products produced by a processing from adhering to the chamber 12. The shield 34 may be an aluminum member coated with ceramics such as $Y_2O_3$.

An exhaust path is formed between the substrate support 14 and the side wall of the chamber 12. The exhaust path is connected to an exhaust port 12e formed at the bottom of the chamber 12. The exhaust port 12e is connected to the exhaust device 38 via a pipe 36. The exhaust device 38 includes a pressure controller and a vacuum pump such as a turbo molecular pump (TMP). A baffle plate 40 is disposed in the exhaust path, that is, between the substrate support 14 and the side wall of the chamber 12. The baffle plate 40 has a plurality of through holes penetrating the baffle plate 40 in the thickness direction thereof. The baffle plate 40 may be an aluminum member of which surface is coated with ceramics such as $Y_2O_3$.

An opening is formed in the upper side of the chamber 12. The opening is closed by a dielectric window 42. The dielectric window 42 is formed of, for example, quartz. The dielectric window 42 is, for example, a flat plate.

A gas supply port 12i is formed on the side wall of the chamber 12. The gas supply port 12i is connected to a gas supply 44 via a gas supply pipe 46. The gas supply 44 supplies various gases used for a processing to the internal space 12c. The gas supply 44 includes a plurality of gas sources 44a, a plurality of flow rate controllers 44b, and a plurality of valves 44c. Although not explicitly illustrated in FIG. 1, different gas supply ports may be provided for respective gases to be supplied, so that the gases do not mix with each other.

The plurality of gas sources 44a include gas sources of various gases to be described later. One gas source may supply one or more gases. The plurality of flow rate controllers 44b may be mass flow controllers (MFC). Each flow rate controller 44b implements the flow rate control through a pressure control. Each gas source included in the plurality of gas sources 44a is connected to the gas supply port 12i via one corresponding flow rate controller among the plurality of flow rate controllers 44b and one corresponding valve among the plurality of valves 44c. The position of the gas supply port 12i is not particularly limited. For example, the gas supply port 12i may be formed in the dielectric window 42, rather than in the side wall of the chamber 12.

An opening 12p is formed in the side wall of the chamber 12. The opening 12p serves as a carry-in/out passage for the substrate W. The substrate W is carried into the internal space 12c of the chamber 12 from the outside through the opening 12p, and is carried out from the inside of the internal space 12c to the outside of the chamber 12. A gate valve 48 is provided on the side wall of the chamber 12, such that the opening 12p may be opened and closed by the gate valve 48.

An antenna 50 and a shield 60 are arranged on the chamber 12 and the dielectric window 42. The antenna 50 and the shield 60 are arranged outside the chamber 12. In an embodiment, the antenna 50 includes an inner antenna element 52A and an outer antenna element 52B. The inner antenna element 52A is a spiral coil disposed in the center of the dielectric window 42. The outer antenna element 52B is a spiral coil disposed above the dielectric window 42 on the outer peripheral side of the inner antenna element 52A. The inner antenna element 52A and the outer antenna element 52B are each made of a conductive material such as copper, aluminum, or stainless steel.

The inner antenna element 52A and the outer antenna element 52B are clamped by a plurality of clamps 54 to be held together. Each of the plurality of clamps 54 has a rod shape. The plurality of clamps 54 extend radially from substantially the center of the inner antenna element 52A toward the outer periphery of the outer antenna element 52B.

The antenna 50 is covered with the shield 60. The shield 60 includes an inner shield wall 62A and an outer shield wall 62B. The inner shield wall 62A has a cylindrical shape. The inner shield wall 62A is disposed between the inner antenna element 52A and the outer antenna element 52B to surround the inner antenna element 52A. The outer shield wall 62B has a cylindrical shape. The outer shield wall 62B is disposed outside the outer antenna element 52B to surround the outer antenna element 52B.

A disc-shaped inner shield plate 64A is disposed on the inner antenna element 52A. The inner shield plate 64A covers the opening of the inner shield wall 62A. A flat ring-shaped outer shield plate 64B is disposed on the outer antenna element 52B. The outer shield plate 64B covers the opening between the inner shield wall 62A and the outer shield wall 62B.

The shapes of the shield walls and the shield plates included in the shield 60 are not limited to those described above. For example, the shield wall of the shield 60 may have a prism shape with a quadrangular cross section.

The inner antenna element 52A and the outer antenna element 52B are connected to radio-frequency power supplies 70A and 70B, respectively. The radio-frequency power supplies 70A and 70B supply powers having the same or different frequencies to the inner antenna element 52A and the outer antenna element 52B, respectively. When the radio-frequency power is supplied from the radio-frequency power supply 70A to the inner antenna element 52A, an induced magnetic field is generated in the internal space 12c, and excites a gas in the internal space 12c to generate plasma above the center of the substrate W. Meanwhile, when the radio-frequency power is supplied from the radio-frequency power supply 70B to the outer antenna element 52B, an induced magnetic field is generated in the internal space 12c, and excites a gas in the internal space 12c to generate plasma in a ring shape above the outer periphery of the substrate W. The radio-frequency power supplies 70A and 70B are an example of a plasma generator.

The electrical lengths of the inner antenna element 52A and the outer antenna element 52B are adjusted according to the frequencies output from the radio-frequency power supplies 70A and 70B, respectively. Thus, the positions of the inner shield plate 64A and the outer shield plate 64B in the z-axis direction are independently adjusted by actuators 68A and 68B, respectively.

The plasma processing apparatus 10 further includes a controller 80. The controller 80 is, for example, a computer provided with a processor, a storage unit such as a memory, an input unit, and a display. The controller 80 operates based on control programs or recipe data stored in the storage unit, and controls each component of the plasma processing apparatus 10. For example, the controller 80 controls the plurality of flow rate controllers 44b, the plurality of valves 44c, the exhaust device 38, the radio-frequency power supplies 70A and 70B, the bias power supply 30, the matching device 32, and the heater power supply HP. The controller 80 reads the programs or data from the storage unit, and controls each component of the plasma processing apparatus 10 so as to perform a plasma processing of the plasma processing method according to an embodiment to be described later.

Referring back to FIG. 1, the method MT will be described in detail. Further, the method MT will be described assuming, for example, a case where the substrate W illustrated in FIG. 2 is processed by using the plasma processing apparatus 10, with reference to FIGS. 4A to 8. Another substrate processing apparatus may be used in the method MT. Another substrate may be processed in the method MT.

The method MT may include steps ST0, ST1, ST2, ST3, and step ST4. Steps ST0 to ST4 may be performed in this order. The method MT may be performed in a state where the substrate W is placed on the substrate support 14. The method MT may be performed while maintaining a decompressed environment in the internal space 12c of the chamber 12, without taking the substrate W out from the internal space 12c. That is, in steps ST1 to ST4, the substrate W may be processed in situ. In an embodiment, the method MT may be started in step ST0.

In step ST0, the temperature of the substrate support 14 is controlled to −40° C. or lower. The temperature of the substrate support 14 may be controlled by a coolant supplied to the flow path 24. Step ST0 may be performed in steps ST1 to ST4, except for a first stage of step ST3.

In step ST1, a substrate W having the region RE in which a recess R1 is formed (see FIG. 4B) is provided. The recess R1 may be, for example, a hole or a trench. In an embodiment, the recess R1 is formed by partially etching the region RE. The region RE may be etched using plasma. In an embodiment, step ST1 is a step of providing the substrate W in which the recess R1 is formed by etching the region RE in a state where the temperature of the substrate support 14 is controlled to −40° C. or lower.

Figure 4A:
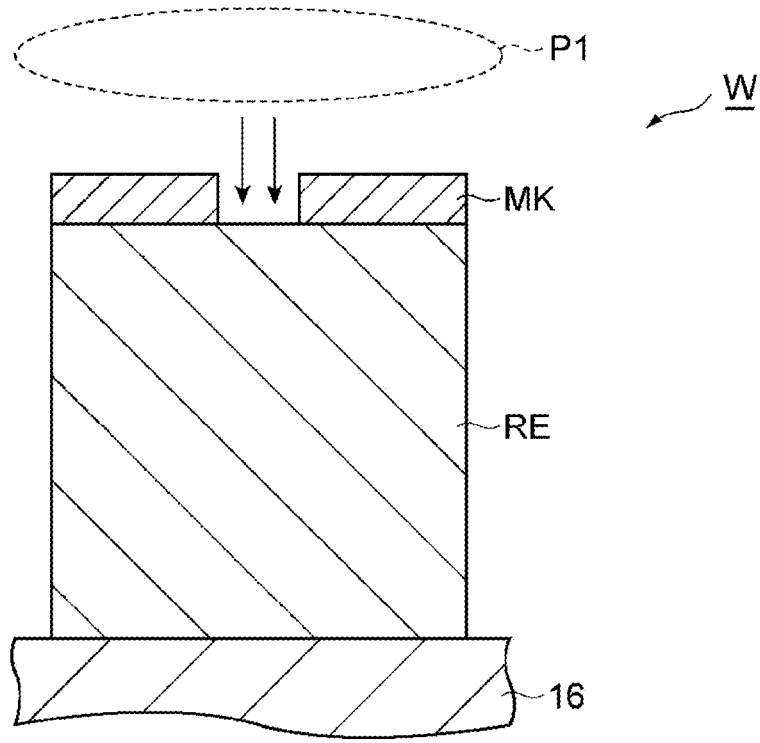
FIG. 4A is a view illustrating an example of a step of providing a substrate having an etching target film with a recess formed therein.
Figure 4B:
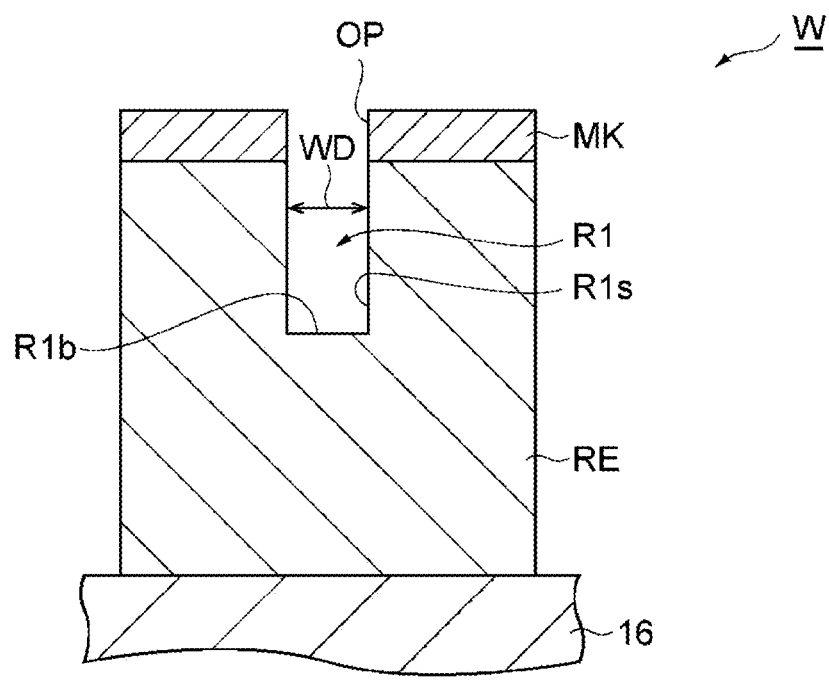
FIG. 4B is a partially enlarged cross-sectional view illustrating an example of the state of the substrate after the step is performed.

FIG. 4A is a view illustrating an example of step ST1 of providing the substrate W having the etching target film in which the recess R1 is formed. FIG. 4B is a partially enlarged cross-sectional view illustrating an example of the state of the substrate W after step ST1 is performed. In step ST1, plasma P1 is generated from a processing gas in the chamber 12, as illustrated in FIG. 4A.

The processing gas may include a halogen-containing gas. The halogen-containing gas may not contain carbon atoms and nitrogen atoms. The halogen-containing gas may include at least one of a bromine-containing gas, a chlorine-containing gas, and a fluorine-containing gas. The bromine-containing gas may include HBr gas. The chlorine-containing gas may include $Cl_2$ gas. The fluorine-containing gas may include $SF_6$ gas. The processing gas may include an oxygen-containing gas. The oxygen-containing gas may include, for example, $O_2$ gas.

In step ST1, the etching may be performed in a state where the temperature of the substrate support 14 that supports the substrate W is set to a low temperature of, for example, −50° C. or lower or −40° C. or lower. The controller 80 controls a temperature adjusting mechanism of the plasma processing apparatus 10 to set the temperature of the substrate support 14 to a designated temperature.

In step ST1, as illustrated in FIG. 4A, chemical species from the plasma P1 is supplied to the substrate W, so that the region RE is partially etched by the chemical species. In step ST1, the region RE is etched to a position between the upper surface of the region RE and the lower surface of the region RE. The upper surface of the region RE is the surface of the region RE exposed from the opening of the mask MK. When step ST1 is performed, the recess R1 is formed to extend from the mask MK to the inside of the region RE as illustrated in FIG. 4B. The recess R1 has the side wall R1s and the bottom R1b. The width WD of the recess R1 is the distance between a pair of side walls R1s facing each other. The width WD of the recess R1 may be, for example, 100 nm or less. The distance between adjacent recesses R1 may also be, for example, 100 nm or less.

In step ST1, the controller 80 controls the exhaust device 38 to set the pressure of the gas in the chamber 12 to a designated pressure. The controller 80 controls the gas supply unit 44 to supply the processing gas into the chamber 12. The controller 80 controls the plasma generator to generate the plasma P1 from the processing gas. According to an embodiment, in step ST1, the controller 80 controls the radio-frequency power supplies 70A and 70B and the bias power supply 30 to supply the radio-frequency powers and the bias power.

Further, the recess R1 may be provided in advance in the region RE of the substrate W through a method different from the etching.

Figure 5:
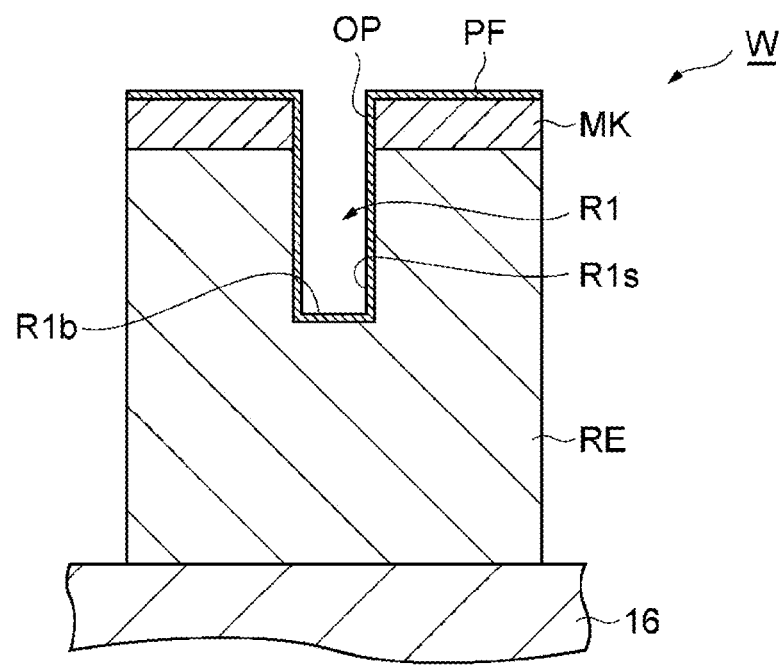
FIG. 5 is a partially enlarged cross-sectional view illustrating an example of the substrate in a step of forming a protective film on the side wall of the recess.

FIG. 5 is a partially enlarged cross-sectional view illustrating an example of the substrate W in step ST2 of forming the protective film PF on the side wall R1s of the recess R1. In step ST2, as illustrated in FIG. 5, the protective film PF is formed on the side wall R1s of the recess R1. The protective film PF may also be formed on the bottom R1b of the recess R1 and the surface of the mask MK. The protective film PF may have a first thickness on the side wall R1s of the recess R1, and a second thickness smaller than the first thickness on the bottom R1b of the recess R1 and the surface of the mask MK. The protective film PF may include, for example, a silicon oxide film.

The protective film PF may be formed through an atomic layer deposition (ALD) method, a chemical vapor deposition (CVD) method), or a physical vapor deposition (PVD) method. The CVD method may be a plasma enhanced CVD method or a CVD method using heat or light. In step ST2 using the CVD method, a film forming gas is supplied into the chamber 12. In step ST2 using the CVD method, plasma may be generated from the film forming gas in the chamber 12.

In step ST2 using the ALD method, a precursor layer is formed on the surface of the substrate W. A first gas is used for forming the precursor layer. The first gas contains a substance that forms the precursor layer. The precursor layer may be formed without generating plasma from the first gas. Alternatively, the precursor layer may be formed using the chemical species from the plasma generated from the first gas.

The first gas contains monosilane ($SiH_4$), disilane ($Si_2H_6$), silicon chloride, chlorosilane, or silicon fluoride. Examples of silicon chloride include silicon tetrachloride ($SiCl_4$) and hexachlorodisilane ($Si_2Cl_6$). Examples of chlorosilane include trichlorosilane ($HSiCl_3$), dichlorosilane ($H_2SiCl_2$), and chlorotrimethylsilane (($CH_3)_3SiCl$). Examples of silicon fluoride include silicon tetrafluoride ($SiF_4$).

The controller 80 controls the gas supply 44 to supply the first gas into the chamber 12. The controller 80 controls the exhaust device 38 to set the pressure of the gas in the chamber 12 to a designated pressure. When plasma is generated, the controller 80 controls the plasma generator to generate plasma from the first gas in the chamber 12. In an embodiment, in order to generate plasma from the first gas, the controller 80 controls the radio-frequency power supply 61 and/or the bias power supply 62 to supply a radio-frequency power HF and/or a radio-frequency power LF.

After the precursor layer is formed, a purging of the internal space 12c may be performed. The controller 80 may control the exhaust device 38 to perform the exhaust of the internal space 12c. The controller 80 may control the gas supply 44 to supply an inert gas into the chamber 12. By performing the purging, the first gas in the chamber 12 may be replaced with the inert gas. By performing the purging, an excessive substance adsorbed onto the substrate W may be removed. As a result of the purging, the precursor layer may be formed on the substrate W as a monomolecular layer.

After the purging is performed, the protective film PF is formed from the precursor layer. A second gas for forming the protective film PF may be used. The second gas contains a reactive species that reacts with the substance of the precursor layer thereby forming the protective film PF from the precursor layer. The second gas includes an oxygen-containing gas (e.g., $O_2$ gas). The protective film PF may be formed without generating plasma from the second gas. Alternatively, the protective film PF may be formed using chemical species of plasma generated from the second gas. Alternatively, the precursor layer may be activated by heat or light.

The controller 80 controls the gas supply 44 to supply the second gas into the chamber 12. The controller 80 controls the exhaust device 38 to set the pressure of the gas in the chamber 12 to a designated pressure. When plasma is generated, the controller 80 controls the plasma generator to generate plasma from the second gas in the chamber 12. In an embodiment, in order to generate plasma from the second gas, the controller 80 controls the radio-frequency power supplies 70A and 70B and/or the bias power supply 30 to supply radio-frequency powers. Alternatively, the controller 80 may control the heater power supply HP to heat the substrate W for activating the precursor layer. Alternatively, the controller 80 may control a light source to irradiate the substrate W with light for activating the precursor layer.

After the protective film PF is formed, a purging of the interior space 12c may be performed. By performing the purging, the second gas in the chamber 12 may be replaced with the inert gas.

The thickness of the protective film PF may be adjusted by repeating the formation of the precursor layer and the purging.

Step ST3 includes first and second stages. Step ST3 is started in the first stage. The second stage is performed after the first stage. Step ST3 may include one or more steps performed after the second stage.

Figure 6A:
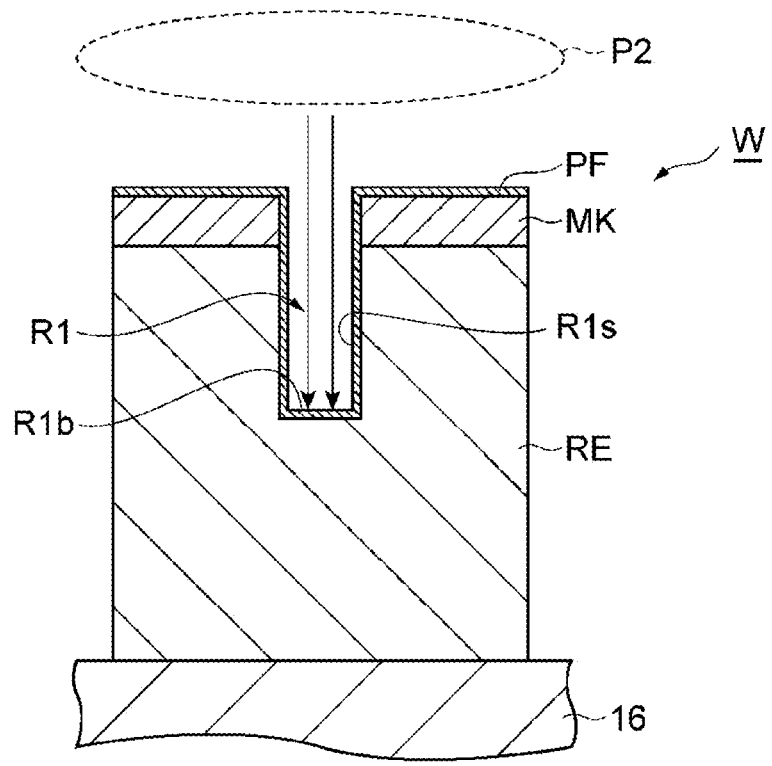
FIG. 6A is a view illustrating an example of a first stage of a step of etching the bottom of the recess.
Figure 6B:
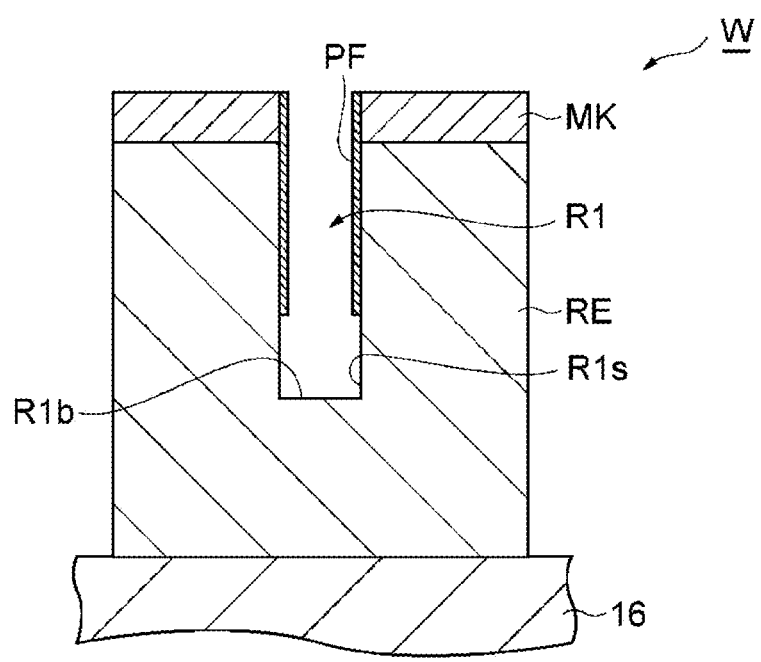
FIG. 6B is a partially enlarged cross-sectional view illustrating an example of the state of the substrate after the first stage is performed.
Figure 7A:
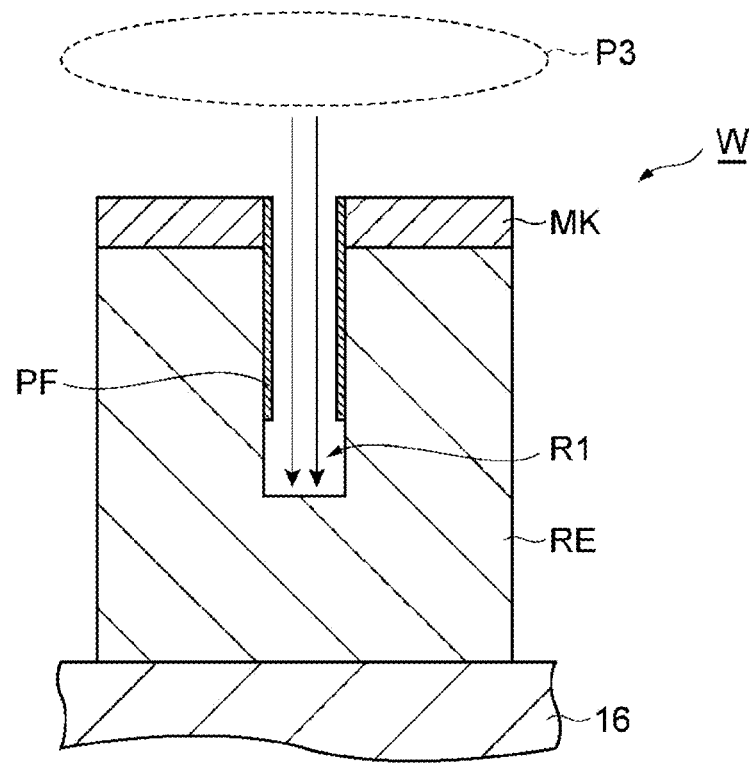
FIG. 7A is a view illustrating an example of a second stage of the step of etching the bottom of the recess.

FIG. 6A is a view illustrating an example of the first stage of step ST3 for etching the bottom R1b of the recess R1. FIG. 6B is a partially enlarged cross-sectional view illustrating an example of the state of the substrate W after the first stage is performed. FIG. 7A is a view illustrating an example of the second stage of step ST3 for etching the bottom R1b of the recess R1, and FIG. 7B is a view illustrating an example of the state of the substrate W after the second stage is performed.

In the first stage, as illustrated in FIGS. 6A and 6B, the bottom R1b of the recess R1 is etched while suppressing the formation of a shoulder portion that occurs when reaction by-products produced by the etching adhere to the side wall R1s. The formation of the shoulder portion is suppressed by suppressing the adhesion of the reaction by-products to the side wall R1s and/or by removing the reaction by-products adhering to the side wall R1s. In an embodiment, plasma P2 is generated from the processing gas in the chamber 12, so that the bottom R1b of the recess R1 is etched. In an embodiment, the bottom R1b of the recess R1 is etched by chemical species of the plasma P2. The type of the processing gas in the first stage may be the same as the processing gas in step ST1.

Figure 7B:
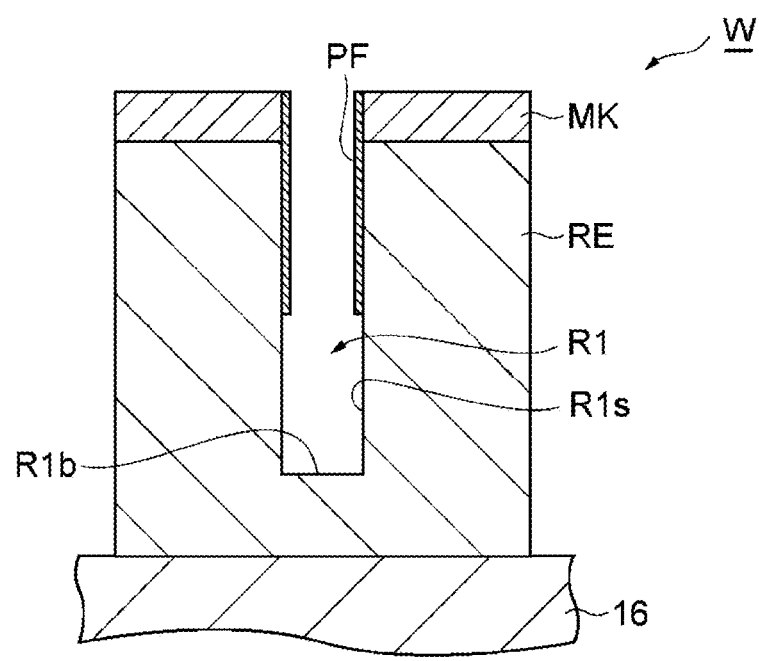
FIG. 7B is a partially enlarged cross-sectional view illustrating an example of the state of the substrate after the second stage is performed.

In the second stage, as illustrated in FIGS. 7A and 7B, the bottom R1b of the recess R1 is further etched. Plasma P3 is generated from the processing gas in the chamber 12, so that the bottom R1b of the recess R1 is etched. In an embodiment, the bottom R1b of the recess R1 is etched by chemical species of the plasma P3. The type of the processing gas in the second stage may be the same as the processing gas in the first stage.

In step ST3, the switching from the first stage to the second stage may be performed in a state where plasma is generated. The etching conditions in the second stage may be the same as the etching conditions in step ST1.

In an embodiment, in the first stage, the etching may be performed in a state where the temperature of the substrate support 14 is set to a first temperature T1. The first temperature T1 may be higher than, for example, −40° C. or may be higher than −30° C. The first temperature T1 may be −20° C. or lower. In the second stage, the etching may be performed in a state where the temperature of the substrate support 14 is set to a second temperature T2 lower than the first temperature T1. The second temperature T2 may be, for example, less than −50° C. or −40° C. or lower. The second temperature T2 may be −100° C. or higher. In the present embodiment, the type and the flow rate of the gas contained in the processing gas in the first stage may be the same as the type and the flow rate of the gas contained in the processing gas in the second stage. In the first and second stages, the ratio of the flow rate of the oxygen-containing gas to the total flow rate of the halogen-containing gas that contains no carbon atoms and nitrogen atoms, and the oxygen-containing gas may be larger than 35 vol %, larger than 30 vol %, or larger than 25 vol %.

In another embodiment, in the first stage, the etching may be performed in a state where the ratio of the flow rate of the oxygen-containing gas to the total flow rate of the halogen-containing gas that contains no carbon atoms and nitrogen atoms, and the oxygen-containing gas is set to a first ratio RT1. The first ratio RT1 may be 35 vol % or less, 30 vol % or less, or 25 vol % or less. In the second stage, the etching may be performed in a state where the ratio of the flow rate of the oxygen-containing gas to the total flow rate of the halogen-containing gas that contains no carbon atoms and nitrogen atoms, and the oxygen-containing gas is set to a second ratio RT2. The second ratio RT2 is larger than the first ratio RT1. The second ratio RT2 may be larger than 35 vol %, larger than 30 vol %, or larger than 25 vol %. In the present embodiment, the temperature of the substrate support 14 in the first stage may be the same as the temperature of the substrate support 14 in the second stage. The temperature of the substrate support 14 in the first and second stages may be, for example, lower than −50° C. or −40° C. or lower.

The time period of the first stage may be, for example, 10 seconds or more and 30 seconds or less. The time period of the second stage may be, for example, 30 seconds or more and 60 seconds or less. The time period of the second stage may be one or more times the time period of the first stage, or may be six times or less the time period of the first stage. The etching depth of the recess R1 formed during the time period of the first stage may be, for example, 100 nm or more or 200 nm or more, or may be 1 μm or less or 500 nm or less.

In step ST3, the controller 80 controls the temperature adjusting mechanism of the plasma processing apparatus 1 to set the temperature of the substrate support 14 to a designated temperature. The controller 80 controls the exhaust device 38 to set the pressure of the gas in the chamber 12 to a designated pressure. The controller 80 controls the gas supply 44 to supply the processing gas that includes a designated type of gas with a designated flow rate, into the chamber 12. The controller 80 controls the plasma generator to generate the plasma P3 from the processing gas. In an embodiment, the controller 80 controls the radio-frequency power supplies 70A and 70B and the bias power supply 30 to supply the radio-frequency powers and the bias power.

Figure 8:
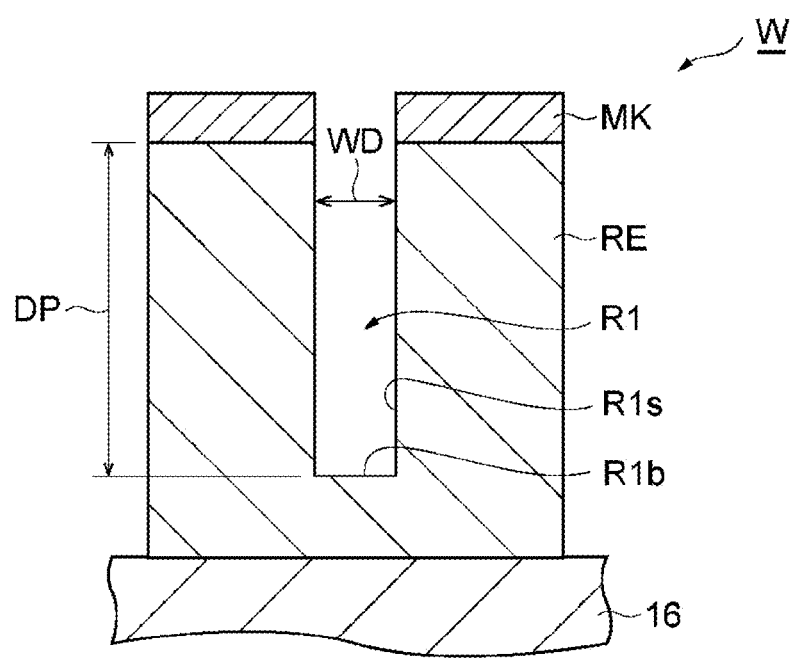
FIG. 8 is a partially enlarged cross-sectional view illustrating an example of the state of the substrate after a sequence including the etching and the formation of the protective film is performed once or more times.

FIG. 8 is a partially enlarged cross-sectional view illustrating an example of the state of the substrate W after the performance of step ST4 in which a sequence including the etching and the formation of the protective film PF is performed once or more times. In step ST4, step ST2 of forming the protective film PF and step ST3 of etching the bottom R1b of the recess R1 are repeated. Step ST4 is performed until the number of repeating times reaches a threshold value. Step ST4 is performed until the depth DP of the recess R1 reaches a desired depth, as illustrated in FIG. 8. After step ST4, the depth DP is, for example, 3 μm or more. After step ST4, the aspect ratio of the recess R1 may be 30 or more. When step ST4 is completed, the method MT is completed.

According to the method MT described above, the shape defect (bowing) of the side wall R1s of the recess R1 formed by the etching may be suppressed.

The mechanism that suppresses the bowing of the side wall R1s of the recess R1 is understood as described herein below, but is not limited thereto. When the bottom of the recess is etched in a state where the temperature of the substrate support 14 is set to a specific temperature, the bowing may occur in the side wall of the recess formed by the etching. Or, when the bottom of the recess is etched in a state where the ratio of the flow rate of the oxygen-containing gas is set to a specific ratio, the bowing may occur in the side wall of the recess formed by the etching.

The mechanism of the occurrence of the bowing is understood as described hereinafter, but is not limited thereto. When the bottom of the recess is etched in a state where the temperature of the substrate support 14 and the ratio of the flow rate of the oxygen-containing gas are constant, reaction by-products produced by the etching adhere to the side wall of the recess at the initial stage of the etching, and a shoulder portion is formed to protrude inward from the side wall. The size of the shoulder portion increases as the temperature of the substrate support 14 is lowered, and increases as the ratio of the flow rate of the oxygen-containing gas increases. Then, the etching proceeds laterally due to the shoulder portion, and as a result, the bowing occurs.

Meanwhile, in the method MT described above, the bottom R1b of the recess R1 is etched while suppressing the formation of the shoulder portion in the first stage. More specifically, the bottom R1b of the recess R1 is etched under a condition that suppresses reaction by-products from adhering to the side wall R1s of the recess R1 during the etching, or a condition that removes reaction by-products adhering to the side wall R1s through the etching. In order to perform this etching, for example, the temperature of the substrate support 14, the type, mixing ratio, and flow rate of the processing gas, the pressure in the chamber, and the magnitudes of the radio-frequency powers and the bias power are controlled. In an example, the bottom R1b of the recess R1 is etched in a state where the temperature of the substrate support 14 is set to the relatively high first temperature T1. Alternatively, the bottom R1b of the recess R1 is etched in a state where the ratio of the flow rate of the oxygen-containing gas is set to the relatively low first ratio RT1 in the first stage. As a result, the shoulder portion is hardly formed in the first stage (the initial stage of etching) as described above, so that the lateral etching caused from the shoulder portion is suppressed, and the occurrence of the bowing is suppressed even after the second stage is completed (after the etching is completed).

Usually, when the temperature of the substrate support 14 is −40° C. or lower at the initial stage of etching, the shape defect that may occur in the side wall of the recess formed by the etching is aggravated. Meanwhile, in the method MT described above, the temperature of the substrate support 14 is set to the relatively high first temperature T1 in the first stage. Accordingly, the shape defect of the side wall R1s of the recess R1 formed by the etching may be suppressed.

When the width of the recess is relatively small, the shape defect may occur in the side wall of the recess as a result of the etching that does not proceed linearly downward. Even in that case, according to the method MT described above, the shape defect of the side wall R1s of the recess R1 formed by the etching may be suppressed.

When the aspect ratio of the recess is relatively high, the shape defect may occur in the side wall of the recess as a result of the etching that does not proceed linearly downward. Even in that case, according to the method MT described above, the shape defect of the side wall R1s of the recess R1 formed by the etching may be suppressed.

While various embodiments have been described, various additions, omissions, substitutions, and changes may be made without being limited to the embodiments. Further, the components in the different embodiments may be combined with each other to form another embodiment.

For example, the substrate processing apparatus used to perform the method MT may be any type of plasma processing apparatus. For example, the substrate processing apparatus used to perform the method MT may be an inductively coupled plasma processing apparatus, other than the plasma processing apparatus 10. The substrate processing apparatus used to perform the method MT may be a capacitively coupled plasma processing apparatus, an electron cyclotron resonance (ECR) plasma processing apparatus, or a plasma processing apparatus that uses surface waves such as microwaves for generating plasma.

The substrate processing apparatus used to perform the method MT may include a first chamber for forming a protective film and a second chamber for performing an etching, instead of the single chamber. In this case, the substrate W may be transferred between the first chamber and the second chamber under a decompressed environment. Alternatively, the substrate W may be taken out from a decompressed environment, transferred between the first chamber and the second chamber under atmospheric pressure, and returned to the decompressed environment.

Hereinafter, various experiments conducted for evaluating the method MT will be described. The experiments described below do not limit the present disclosure.

(First Experiment)

In a first experiment, five sample substrates having the same structure as that of the substrate W illustrated in FIG. 2 were prepared. Each sample substrate had a silicon-containing film and a mask provided on the silicon-containing film. The silicon-containing film was a silicon single crystal film. In the first experiment, plasma was generated from the processing gas using a plasma processing apparatus having the same structure as that of the plasma processing apparatus 10 of FIG. 3, and the silicon-containing film of each sample substrate was etched.

The first sample substrate was subjected to a first etching for 60 seconds, and then, subjected to a second etching for 60 seconds after an interval of 80 seconds from the first etching. In each of the first and second etchings, the temperature of the substrate support 14 was −50° C. The radio-frequency power supplies 70A and 70B supplied the radio-frequency powers to the inner antenna element 52A and the outer antenna element 52B, respectively. Further, the bias power supply 30 supplied the bias power to the lower electrode 18. In each of the first and second etchings, the ratio of the flow rate of the oxygen-containing gas to the total flow rate of the halogen-containing gas and the oxygen-containing gas was 35 vol %. Further, HBr gas and $SF_6$ gas were used as the halogen-containing gas.

The etching conditions for the second sample substrate were the same as the etching conditions for the first sample substrate, except that the temperature of the substrate support 14 was −45° C.

The etching conditions for the third sample substrate were the same as the etching conditions for the first sample substrate, except that the temperature of the substrate support 14 was −40° C., and the ratio of the flow rate of the oxygen-containing gas to the total flow rate of the halogen-containing gas and the oxygen-containing gas in the first etching was 37 vol %.

The etching conditions for the fourth sample substrate were the same as the etching conditions for the first sample substrate, except that the temperature of the substrate support 14 was −35° C., and the ratio of the flow rate of the oxygen-containing gas to the total flow rate of the halogen-containing gas and the oxygen-containing gas in the first etching was 38 vol %.

The etching conditions for the fifth sample substrate were the same as the etching conditions for the first sample substrate, except that the temperature of the substrate support 14 was −20° C., and the ratio of the flow rate of the oxygen-containing gas to the total flow rate of the halogen-containing gas and the oxygen-containing gas in the first etching was 40 vol %.

FIGS. 9A to 9E are views schematically illustrating an example of the shape of the side wall of the recess formed by the etching. FIGS. 9A to 9E illustrate the cross sections of the first to fifth sample substrates, respectively. From FIGS. 9A to 9E, it may be found out that the occurrence of bowing in the side wall of the recess is suppressed as the temperature of the substrate support 14 increases. When the temperature of the substrate support 14 is higher than −40° C., the occurrence of bowing is remarkably suppressed.

(Second Experiment)

In a second experiment, three sample substrates having the same structure as that of the substrate W illustrated in FIG. 2 were prepared. Each sample substrate had a silicon-containing film and a mask provided on the silicon-containing film. The silicon-containing film was a silicon single crystal film. In the second experiment, plasma was generated from the processing gas using a plasma processing apparatus having the same structure as that of the plasma processing apparatus 10 of FIG. 3, and the silicon-containing film of each sample substrate was etched.

The first sample substrate was subjected to a first etching for 60 seconds, and then, subjected to a second etching for 20 seconds after an interval of 80 seconds from the first etching. In each of the first and second etchings, the temperature of the substrate support 14 was −50° C. The radio-frequency power supplies 70A and 70B supplied the radio-frequency powers to the inner antenna element 52A and the outer antenna element 52B, respectively. Further, the bias power supply 30 supplied the bias power to the lower electrode 18. In the first etching, the ratio of the flow rate of the oxygen-containing gas to the total flow rate of the halogen-containing gas and the oxygen-containing gas was 35 vol %. In the second etching, the ratio of the flow rate of the oxygen-containing gas to the total flow rate of the halogen-containing gas and the oxygen-containing gas was 40 vol %. Further, in both the first and second etchings, HBr gas and $SF_6$ gas were used as the halogen-containing gas.

The etching conditions for the second sample substrate were the same as the etching conditions for the first sample substrate, except that the ratio of the flow rate of the oxygen-containing gas to the total flow rate of the halogen-containing gas and the oxygen-containing gas in the second etching was 35 vol %.

The etching conditions for the third sample substrate were the same as the etching conditions for the first sample substrate, except that the ratio of the flow rate of the oxygen-containing gas to the total flow rate of the halogen-containing gas and the oxygen-containing gas in the second etching was 25 vol %.

Figure 10A:
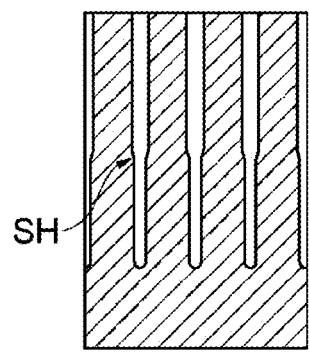
FIGS. 10A to 10C are views schematically illustrating an example of the shape of the side wall of the recess formed by the etching.
Figure 10B:
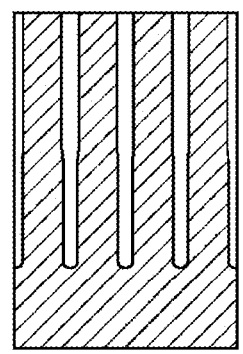
Figure 10C:
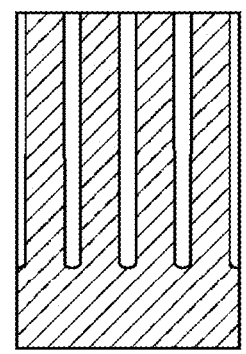

FIGS. 10A to 10C are views schematically illustrating an example of the shape of the side wall of the recess formed by the etching. FIGS. 10A to 10C illustrate the cross sections of the first to third sample substrates, respectively. From FIGS. 10A to 10C, it is found out that the generation of the shoulder portion SH formed on the side wall of the recess is suppressed as the ratio of the flow rate of the $O_2$ gas to the total flow rate of the halogen-containing gas and the oxygen-containing gas decreases. When the ratio of the flow rate of the oxygen-containing gas to the total flow rate of the halogen-containing gas and the oxygen-containing gas is 25 vol % or less, the generation of the shoulder portion SH is remarkably suppressed.

(Third Experiment)

In a third experiment, four sample substrates having the same structure as that of the substrate W illustrated in FIG. 2 were prepared. Each sample substrate had a silicon-containing film and a mask provided on the silicon-containing film. The silicon-containing film was a silicon single crystal film. In the third experiment, plasma was generated from the processing gas using a plasma processing apparatus having the same structure as that of the plasma processing apparatus 10 of FIG. 3, and the silicon-containing film of each sample substrate was etched.

As in the second experiment, the first sample substrate was subjected to a first etching for 60 seconds, and then, subjected to a second etching for 20 seconds after an interval of 80 seconds from the first etching. Then, a third etching was performed for 40 seconds. In each of the first to third etchings, the temperature of the substrate support 14 was −50° C. The radio-frequency power supplies 70A and 70B supplied the radio-frequency powers to the inner antenna element 52A and the outer antenna element 52B, respectively. Further, the bias power supply 30 supplied the bias power to the lower electrode 18. In the first etching, the ratio of the flow rate of the oxygen-containing gas to the total flow rate of the halogen-containing gas and the oxygen-containing gas was 35 vol %. In the second etching, the ratio of the flow rate of the oxygen-containing gas to the total flow rate of the halogen-containing gas and the oxygen-containing gas was 40 vol %. In the third etching, the ratio of the flow rate of the oxygen-containing gas to the total flow rate of the halogen-containing gas and the oxygen-containing gas was 35 vol %. Further, in both the first and second etchings, HBr gas and $SF_6$ gas were used as the halogen-containing gas.

The etching conditions for the second sample substrate were the same as the etching conditions for the first sample substrate, except that the ratio of the flow rate of the oxygen-containing gas to the total flow rate of the halogen-containing gas and the oxygen-containing gas in the second etching was 35 vol %.

The etching conditions for the third sample substrate were the same as the etching conditions for the first sample substrate, except that the ratio of the flow rate of the oxygen-containing gas to the total flow rate of the halogen-containing gas and the oxygen-containing gas in the second etching was 30 vol %.

The etching conditions for the fourth sample substrate were the same as the etching conditions for the first sample substrate, except that the ratio of the flow rate of the oxygen-containing gas to the total flow rate of the halogen-containing gas and the oxygen-containing gas in the second etching was 25 vol %.

FIGS. 11A to 11D are views schematically illustrating an example of the shape of the side wall of the recess formed by the etching. FIGS. 11A to 11D illustrate the cross sections of the first to fourth sample substrates, respectively. From FIGS. 11A to 11D, it is found out that the occurrence of bowing in the side wall of the recess is suppressed as the ratio of the flow rate of the oxygen-containing gas to the total flow rate of the halogen-containing gas and the oxygen-containing gas decreases. When the ratio of the flow rate of the oxygen-containing gas to the total flow rate of the halogen-containing gas and the oxygen-containing gas is 30 vol % or less, the occurrence of bowing is remarkably suppressed.

According to an embodiment, it is possible to suppress a shape defect of the side wall of a recess formed by an etching.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing method comprising:
   (a) providing a substrate having an etching target film with a recess formed therein, on a substrate support;
   (b) forming a protective film on a side wall of the recess;
   (c) after (b), generating plasma from a processing gas to etch a bottom of the recess; and
   (d) performing a sequence including (1)) and (c) one or more times,
   wherein (c) includes
   (c–1) etching the bottom of the recess while suppressing a formation of a shoulder portion caused when by-products produced by the etching adhere to the side wall, and
   (c–2) further etching the bottom of the recess in a state where a temperature of the substrate support is controlled to −40° C. or lower, after (c–1).

2. The substrate processing method according to claim 1, wherein the formation of the shoulder portion is suppressed by suppressing the by-products from adhering to the side wall or by removing the by-products adhering to the side wall.

3. The substrate processing method according to claim 1, wherein in (c–1), the etching is performed in a state where the temperature of the substrate support is set to a temperature higher than −40° C.

4. The substrate processing method according to claim 1, wherein
   the etching target film is a silicon-containing film,
   the processing gas includes a halogen-containing gas that contains no carbon atoms and nitrogen atoms, and an oxygen-containing gas,
   in (c–1), the etching is performed in a state where a ratio of a flow rate of the oxygen-containing gas to a total flow rate of the halogen-containing gas and the oxygen-containing gas is set to a first ratio, and
   in (c–2), the etching is performed in a state where the ratio is set to a second ratio larger than the first ratio.

5. The substrate processing method according to claim 4, wherein the halogen-containing gas includes at least one gas selected from a group consisting of $SF_6$ gas, $Cl_2$ gas, and HBr gas.

6. The substrate processing method according to claim 4, wherein the oxygen-containing gas includes $O_2$ gas.

7. The substrate processing method according to claim 4, wherein the silicon-containing film includes a silicon film or a silicon germanium film.

8. The substrate processing method according to claim 4, wherein the first ratio is 35 vol % or less.

9. The substrate processing method according to claim 1, wherein
   in (a), the substrate with the recess formed therein is provided by etching the etching target film in a state where the temperature of the substrate support is controlled to −40° C or lower, and
   an etching condition in (a) is same as an etching condition in (c–2).

10. The substrate processing method according to claim 1, wherein a time period of (c–2) is six times or less a time period of (c–1).

11. The substrate processing method according to claim 1, wherein an etching depth of the recess etched in (c–1) is 1 μm or less.

12. The substrate processing method according to claim 1, wherein in (c), (c–1) is switched to (c–2) in a state where plasma is generated.

13. The substrate processing method according to claim 1, wherein (a) to (d) are performed in site.

14. The substrate processing method according to claim 1, wherein
   the substrate includes a mask on the etching target film, and
   the protective film has a first thickness on the side wall and a second thickness smaller than the first thickness on the bottom of the recess and a surface of the mask.

15. The substrate processing method according to claim 1, wherein the processing gas includes a halogen-containing gas that contains no carbon atoms and nitrogen atoms, and an oxygen-containing gas, and in (c–1) and (c–2), a ratio of a flow rate of the oxygen-containing gas to a total flow rate of the halogen-containing gas and the oxygen-containing gas is larger than 35 vol %.

* * * * *